Figure 1:
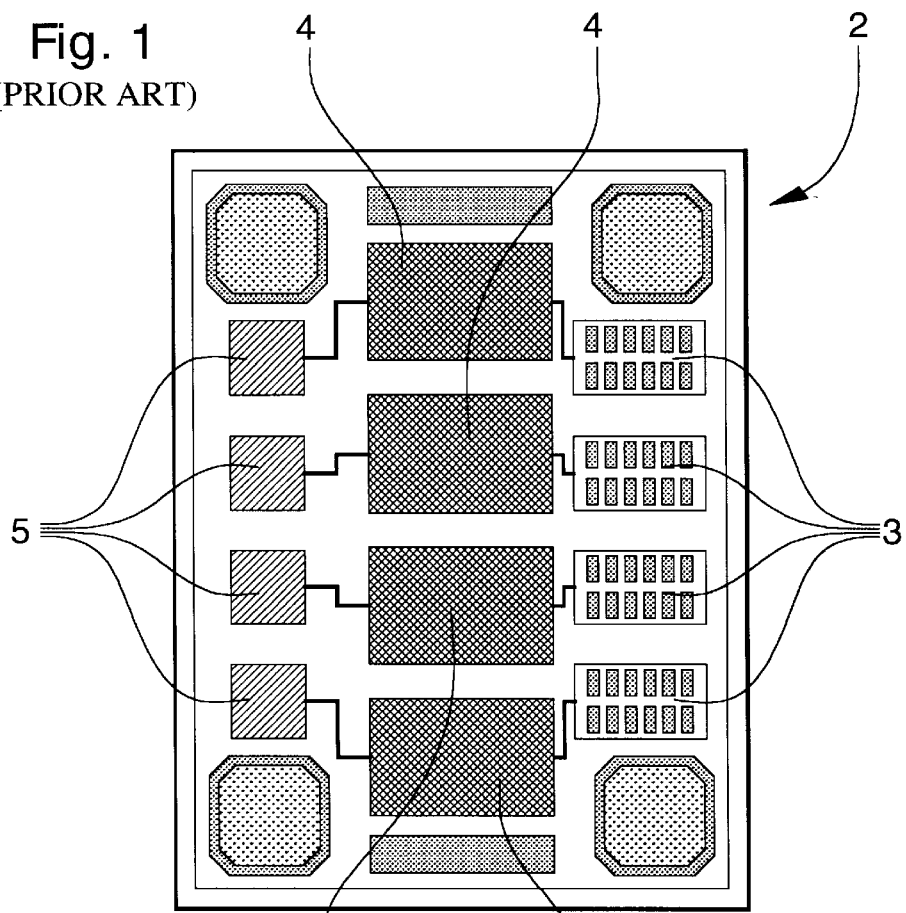

United States Patent [19]
Grandjean et al.

[11] Patent Number: 5,949,129
[45] Date of Patent: Sep. 7, 1999

[54] WAFER COMPRISING OPTOELECTRONIC CIRCUITS AND METHOD OF VERIFYING THIS WAFER

[75] Inventors: André Grandjean, Cressier; Pascal Kunz, Neuchâtel, both of Switzerland

[73] Assignee: EM Microelectronic-Marin SA, Marin, Switzerland

[21] Appl. No.: 09/025,286

[22] Filed: Feb. 16, 1998

[30] Foreign Application Priority Data

Feb. 17, 1997 [CH] Switzerland ................... 0345/97

[51] Int. Cl.⁶ .................... H01L 21/66; H01L 23/48; H01L 33/00; G02B 6/12
[52] U.S. Cl. .............. 257/620; 257/48; 257/82; 257/203; 257/734; 257/786; 257/784; 438/17; 438/15; 324/760; 324/765; 324/73.1
[58] Field of Search ................ 257/734, 203, 257/48, 620, 786, 784, 82, 433, 187; 438/11–15, 17; 371/22.5; 324/760, 765, 158.1, 73.1, 763

[56] References Cited

U.S. PATENT DOCUMENTS

| | | | |
|---|---|---|---|
| 5,357,121 | 10/1994 | Miyashita et al. | 257/82 |
| 5,500,540 | 3/1996 | Jewell et al. | 257/82 |
| 5,557,170 | 9/1996 | Martin et al. | 257/187 |
| 5,712,504 | 1/1998 | Yano et al. | 257/452 |
| 5,793,115 | 8/1998 | Zwrczky et al. | 257/774 |
| 5,818,984 | 10/1998 | Ahmad et al. | 257/80 |

FOREIGN PATENT DOCUMENTS

| | | |
|---|---|---|
| 60-110132 | 6/1985 | Japan . |
| 02 125635 | 5/1990 | Japan . |
| 06 059167 | 3/1994 | Japan . |
| 07 029956 | 1/1995 | Japan . |

OTHER PUBLICATIONS

"Third Level Metal Diagnostic Image", 2244 Research Disclosure, (Sep. 1988), No. 293, p. 659, New York, NY, USA.

*Primary Examiner*—Alexander Oscar Williams
*Attorney, Agent, or Firm*—Richard K. Robinson

[57] ABSTRACT

A wafer (10) is described comprising several integrated optoelectronic circuits of a first type (11), such circuits of the first type each comprising electronic modules (13) and at least a first photodiode (14).

Said wafer (10) is characterised in that it further comprises at least one integrated optoelectronic circuit of a second type (21) comprising electronic modules (23), at least one second photodiode (24) and at least one bonding pad (25) intended to be connected to an external measuring apparatus, said at least one bonding pad (25) being superposed onto said at least one second photodiode (24) so that said at least one circuit (21) of the second type may be used as a circuit for verifying the manufacturing of said wafer.

4 Claims, 2 Drawing Sheets

WAFER COMPRISING OPTOELECTRONIC CIRCUITS AND METHOD OF VERIFYING THIS WAFER

The present invention concerns a wafer, i.e. a wafer in which, in particular, optoelectronic circuits are formed. The invention also concerns a method for verifying the circuits of this wafer.

Wafers comprising optoelectronic circuits have already been proposed. Generally, such a wafer comprises several thousand integrated circuits. Each circuit comprises, amongst other things, at least a bonding pad to allow connection to an external measuring apparatus.

Known methods for verifying such circuits on the wafer use these bonding pads to test the operation of each circuit in order to determine the manufacturing yield of the wafer. Typically, several circuits are tested, in the order of 1 in 20, and if the number of circuits tested which operate properly is above a predetermined threshold, for example 93% of the circuits tested, the other untested circuits are also deemed to operate properly, and the verification of the wafer is stopped. However, if the result is below this predetermined threshold, the other circuits are also each subjected to an individual verification in order to verify whether or not they operate properly.

As is shown in FIG. 1, each integrated optoelectronic circuit, designated by the reference 2, usually comprises modules 3, photodiodes 4 and several bonding pads 5 in order to allow connection thereof to external apparatus, not shown, which send measuring signals to perform tests on the circuit in order to verify that this circuit operates properly. However, these bonding pads occupy a significant area on the wafer, which limits the number of integrated circuits able to be manufactured on a single wafer and thus increases the manufacturing cost of each circuit.

However, the Applicant of the present patent application has noted that only a very small percentage of wafers do not pass the first step of the verifying method described hereinbefore, such percentage being around 1 to 2% of the wafers of a same series.

An aim of the present invention is to overcome the aforementioned drawbacks by providing a wafer comprising integrated optoelectronic circuits, which requires less space for the bonding pads, and which thus leaves more space available for the integrated circuits so that more circuits may be manufactured on a single wafer than was the case for wafers of the prior art.

Another aim of the present invention is to provide a verifying method which assures proper and efficient verification of such wafers.

These aims are achieved as a result of the particular features of the wafer of claim 1 and the method of claim 4.

In fact, a very small number of test circuits is provided on the wafer. Only these circuits comprise bonding pads for verification. These circuits cannot be used normally and are thus "sacrificed" for this purpose. The other circuits do not comprise bonding pads for verification, they occupy less space on the surface of the wafer so that a larger number of integrated circuits may be manufactured on a single wafer.

Figure 2:
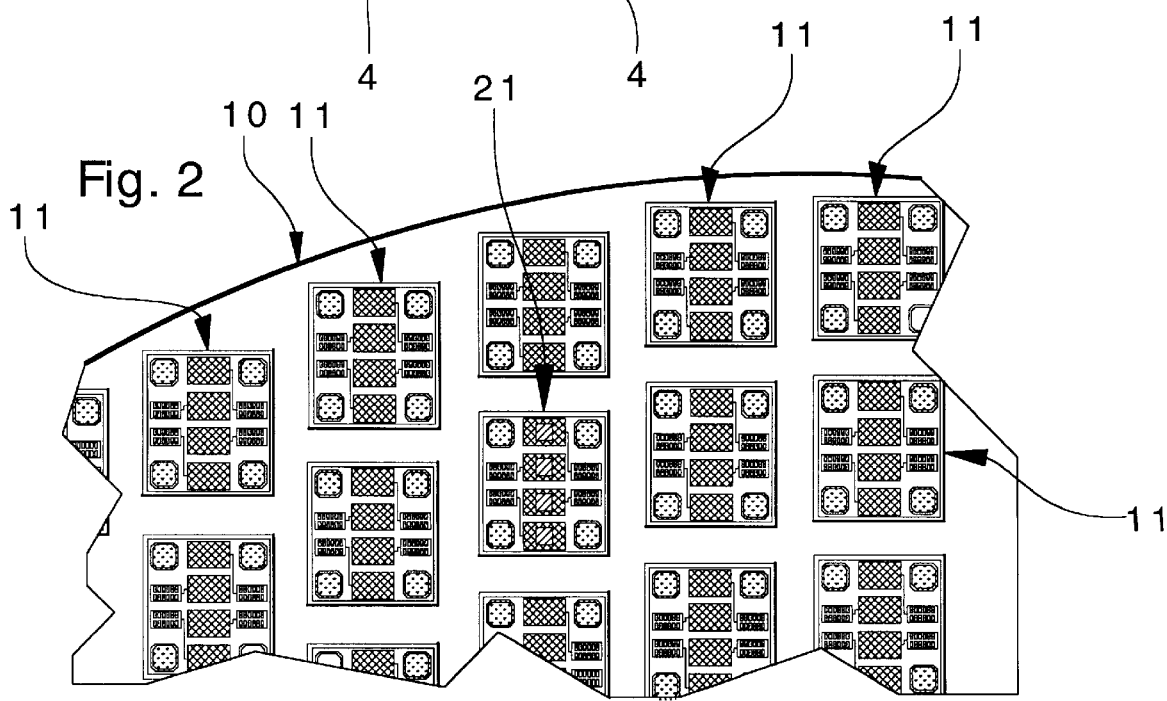
Figure 3:
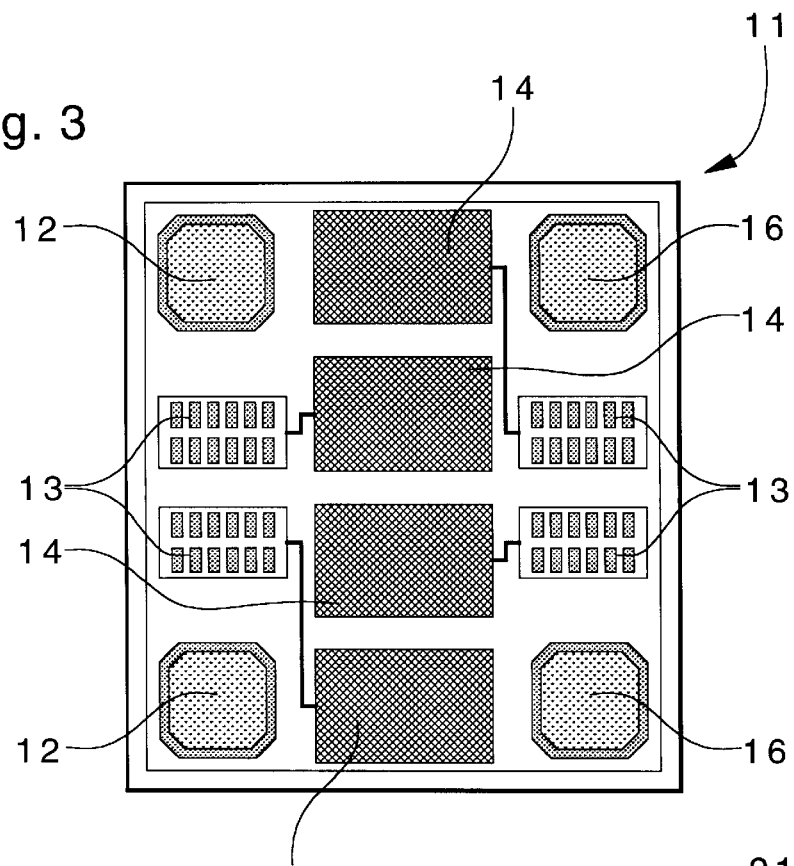
Figure 4:
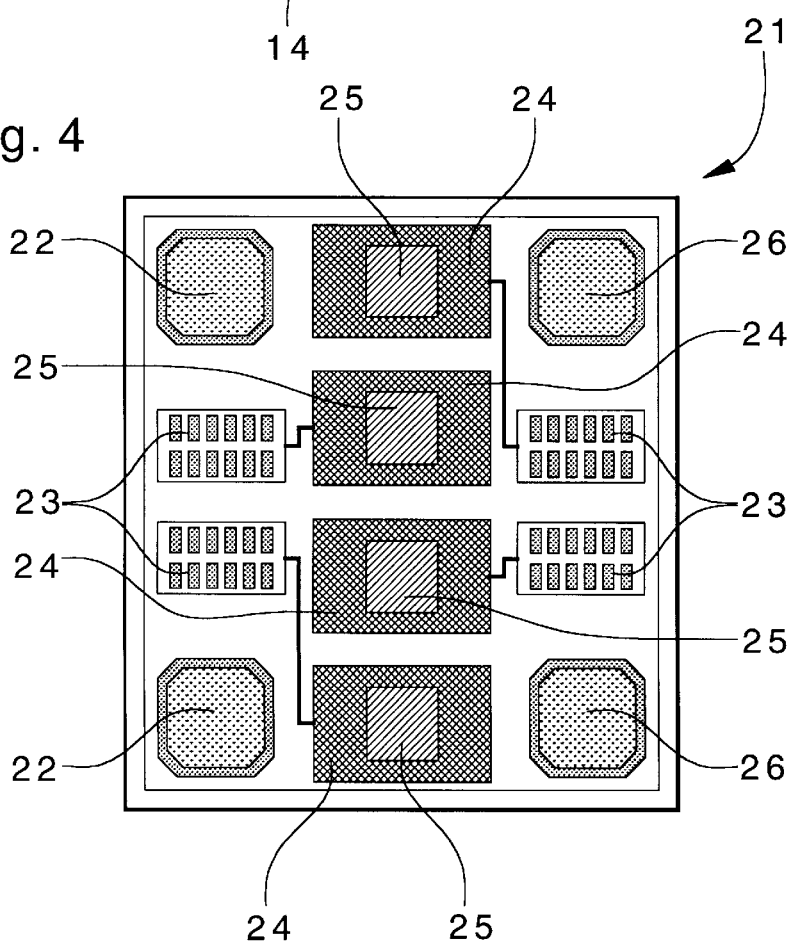

Other features and advantages of the present invention will become clear from the following description which is given solely by way of example, and which will be made with the aid of the attached drawings in which:

FIG. 1 which has already been described shows schematically an integrated optoelectronic circuit in a wafer according to the prior art, FIG. 2 is a partial schematic view of a wafer according to the invention comprising several integrated optoelectronic circuits of a first type and at least one integrated optoelectronic circuit of a second type, FIG. 3 shows schematically the integrated optoelectronic circuit of the first type of FIG. 2, and FIG. 4 shows schematically the integrated optoelectronic circuit of the second type of FIG. 2.

FIG. 2 shows a wafer according to the invention, more particularly a wafer in which, in particular, optoelectronic circuits are formed. Wafer 10 comprises several integrated circuits, typically several thousand circuits, which are manufactured at the same time. The wafer according to the invention comprises two distinct types of integrated circuits, as will be explained hereinafter.

Wafer 10 comprises several integrated optoelectronic circuits of a first type 11 and at least one integrated optoelectronic circuit of a second type 21.

The integrated optoelectronic circuit of the first type 11 is shown schematically in FIG. 3 and comprises, in a known manner, supply terminals 12 and modules 13 which are interconnected. Capacitors 16 forming part of modules 13 may also be provided. Circuit 11 of the first type also comprises at least one photodiode 14 connected to modules 13. It will be noted that circuit 11 of the first type does not contain any bonding pads allowing connection to external measuring apparatus.

Circuit 21 of the second type is shown schematically in FIG. 4 and also comprises supply terminals 22, interconnected modules 23, capacitors 26, if necessary, and at least one photodiode 24 connected to modules 23. Circuit 21 of the second type also comprises at least one bonding pad allowing circuit 21 of the second type to be connected to an external measuring apparatus for verification. Such verification may be performed in a conventional manner as has been explained hereinbefore. In the example, circuit 21 of the second type comprises four photodiodes 24 and four bonding pads 25. However, these bonding pads 25 are superposed on photodiodes 24. In fact, the etching mask used during manufacturing of the wafer has been modified in order to add a bonding pad onto each photodiode of each of these circuits of the second type. The ratio of circuit 21 of the second type to circuit 11 of the first type is preferably 1:35, i.e. there are 35 times more circuits of the first type than of the second type. Of course, it is also possible to select a different ratio of circuits of the first and second types. Indeed, the applicant has observed that a ratio of, for example, 1:56 also gives satisfactory results. Since photodiodes 14 and 24 are connected to modules 13 and 23 respectively in order to assure the desired operation, bonding pads 25 which are superposed onto photodiodes 24 will be able to couple such modules 23 to an external measuring apparatus so that the operation of all the components and of their interconnections may be checked.

Since circuits 11 of the first type do not comprise external bonding pads, the space occupied by each circuit 11 of the first type is reduced, in the order of 30%, with respect to known circuits of the prior art. The surface of a first circuit 11 is approximately 0.69 mm$^2$. Since bonding pads 25 of circuits 21 of the second type are superposed onto photodiodes 24 of such circuits 21 of the second type, the latter do not occupy more space than circuits 11 of the first type. Indeed, in the example described, it is seen that the integrated circuits of the wafer according to the invention are shorter, since the supply terminals and the capacitors were able to be placed closer to the photodiodes due to a better distribution of the modules. Thus, it is possible to manufacture approximately 20,500 circuits on a wafer while the wafers of the prior art could contain only 15,000 circuits.

Even if one accepts that circuits 21 of the second type are in effect sacrificed, because they are only used for verifying the manufacturing of the wafer, there are still approximately 20,000 circuits of the first type per wafer which may be used normally.

It is understood that the price per circuit may therefore be considerably reduced with respect to circuits of the prior art, in the example this reduction is in the order of 30%.

The method of verifying a wafer according to the invention consists of connecting, in a known manner, bonding pads 25 of circuits 21 of the second type to an external measuring apparatus which can send measuring signals. An apparatus of this type is connected to bonding pads 25 of each circuit 21 of the second type, one after the other.

Next, a measuring signal is sent to circuit 21 of the second type which generates a response signal. This response signal is compared to a reference signal in order to determine whether circuit 21 of the second type operates properly. Here also, a yield threshold of, for example, approximately 93% may be used, as was explained hereinbefore. If the number of properly operating circuits 21 of the second type is above this threshold, the wafer is considered to be satisfactory. Conversely, if the result of verifying the circuits of the second type does not reach this threshold, the wafer does not pass the verification and is considered faulty.

In an advantageous manner, it is possible to provide an additional step which follows the verifying method. This consists of an inversion of the connections of bonding pads 25 to modules 23 in order to avoid any inadvertent use of circuits 21 of the second type. Thus, it can be observed immediately that such circuits of the second type do not operate.

Although a preferred embodiment of the wafer and of a verifying method according to the invention are described hereinbefore, the invention is not limited to this specific embodiment, which is given by way of non-limiting example.

What is claimed is:

1. A wafer comprising several integrated optoelectronic circuits of a first type, said circuits of the first type each comprising electronic modules and at least a first photodiode, wherein said wafer further comprises at least one integrated optoelectronic circuit of a second type comprising electronic modules, at least one second photodiode and at least one bonding pad arranged to be connected to an external measuring apparatus, said at least one bonding pad being superposed onto said at least one second photodiode so that said at least one circuit of the second type may be used as a circuit for verifying the manufacturing of said wafer.

2. A wafer according to claim 1, wherein the ratio of circuits of the first type to said at least one circuit of the second type is 35:1.

3. A wafer according to claim 1, wherein the ratio of the circuits of the first type to said at least one circuit of the second type is 56:1.

4. A method of verifying a wafer according to any of the preceding claims, comprising the following steps:

connecting an external measuring apparatus to said wafer via said at least one bonding pad, sending a measuring signal to said at least one circuit of the second type in order to obtain a response signal, comparing the response signal generated by said at least one circuit of the second type to a reference signal, and determining whether said wafer operates properly in light of the result of the comparison.

* * * * *